US009236325B2

(12) United States Patent
Jahnes et al.

(10) Patent No.: US 9,236,325 B2
(45) Date of Patent: Jan. 12, 2016

(54) THROUGH-VIAS FOR WIRING LAYERS OF SEMICONDUTOR DEVICES

(71) Applicant: GLOBALFOUNDRIES U.S. 2 LLC, Hopewell Junction, NY (US)

(72) Inventors: Christopher V. Jahnes, Upper Saddle River, NJ (US); Xiao Hu Liu, Briarcliff Manor, NY (US); Bucknell C. Webb, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/971,100

(22) Filed: Aug. 20, 2013

(65) Prior Publication Data

US 2014/0312467 A1    Oct. 23, 2014

Related U.S. Application Data

(63) Continuation of application No. 13/865,740, filed on Apr. 18, 2013.

(51) Int. Cl.
*H01L 23/48* (2006.01)
*H01L 21/768* (2006.01)

(52) U.S. Cl.
CPC ........ *H01L 23/481* (2013.01); *H01L 21/76877* (2013.01); *H01L 21/76898* (2013.01); *H01L 2924/0002* (2013.01)

(58) Field of Classification Search
CPC .................. H01L 21/76877; H01L 23/481
USPC ........................................... 438/667; 257/774
See application file for complete search history.

(56) References Cited

U.S. PATENT DOCUMENTS

| 6,518,166 B1 | 2/2003 | Chen et al. |
| 6,707,157 B2 * | 3/2004 | Hoshino ................ 257/773 |
| 6,831,363 B2 | 12/2004 | Dalton et al. |

(Continued)

FOREIGN PATENT DOCUMENTS

KR        101074762        10/2011

OTHER PUBLICATIONS

Jung, D., et al. "Properties of Isolation Liner and Electrical Characteristics of High Aspect Ratio TSV in 3D Stacking Technology" 23rd Annual Semi Advanced Semiconductor Manufacturing Conference (ASMC). May 2012. (3 Pages).

(Continued)

*Primary Examiner* — Christine Enad
(74) *Attorney, Agent, or Firm* — Michael LeStrange; Hoffman Warnick LLC

(57) ABSTRACT

Through-via structures and methods of their formation are disclosed. One such structure includes a conductor structure, a dielectric via lining and a stress-abating dielectric material. The conductor structure is formed of conducting material extending through a wiring layer of a semiconductor device and through a semiconductor layer below the wiring layer. Here, the wiring layer of the semiconductor device includes a first dielectric material. The dielectric via lining extends along the conductor structure at least in the semiconductor layer. Further, the stress-abating dielectric material is disposed between the conductor structure and the first dielectric material in at least the wiring layer, where the stress-abating dielectric material is disposed over portions of the semiconductor layer that are outside outer boundaries of the via lining.

7 Claims, 10 Drawing Sheets

(56) References Cited

U.S. PATENT DOCUMENTS

| | | |
|---|---|---|
| 7,866,038 B2 | 1/2011 | Yakabe et al. |
| 7,884,016 B2 | 2/2011 | Sprey et al. |
| 8,232,196 B2 | 7/2012 | Yang et al. |
| 2008/0150089 A1* | 6/2008 | Kwon et al. .......... 257/621 |
| 2010/0176494 A1 | 7/2010 | Chen |
| 2010/0187694 A1 | 7/2010 | Yu et al. |
| 2011/0115047 A1* | 5/2011 | Hebert et al. .......... 257/508 |
| 2011/0223760 A1 | 9/2011 | Hua et al. |
| 2011/0298099 A1 | 12/2011 | Lee et al. |
| 2012/0112361 A1* | 5/2012 | Han et al. .......... 257/774 |
| 2012/0261827 A1* | 10/2012 | Yu et al. .......... 257/774 |
| 2013/0115769 A1* | 5/2013 | Yu et al. .......... 438/667 |

OTHER PUBLICATIONS

Okoro, C., et al. "Effect of Thermal Cycling on the Signal Integrity and Morphology of TSV Isolation Liner—SiO2" 2012 IEEE International Interconnect Technology Conference (IITC). Jun. 2012. (3 Pages).

* cited by examiner

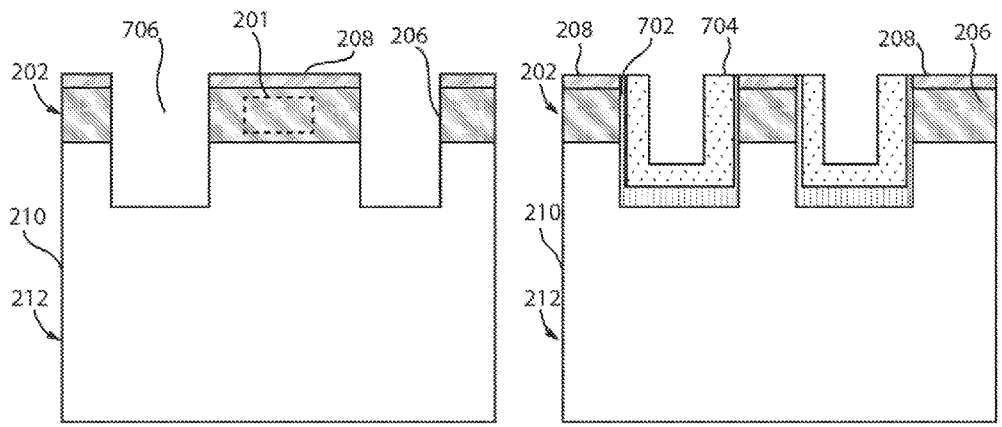
FIG. 7
FIG. 8
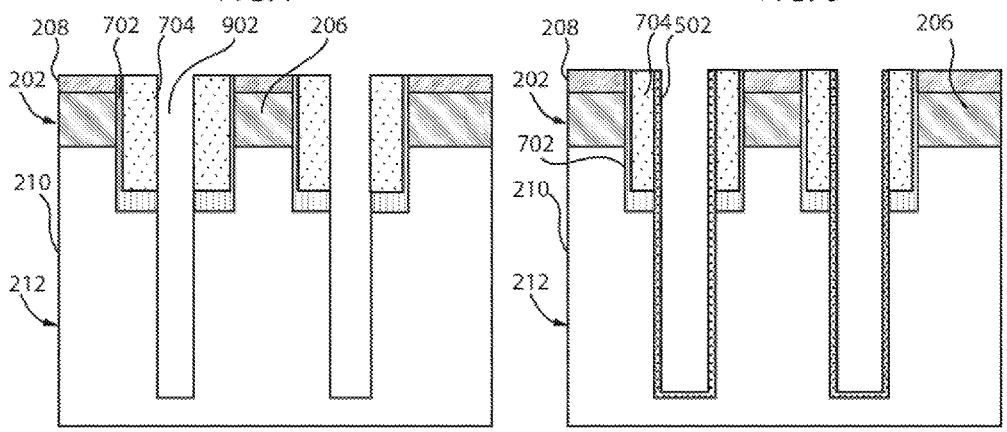
FIG. 9
FIG. 10
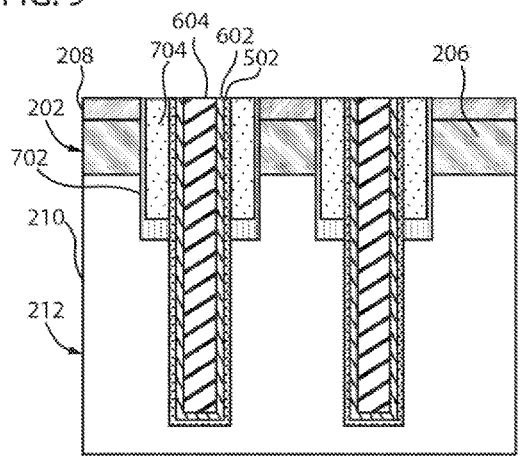
FIG. 11

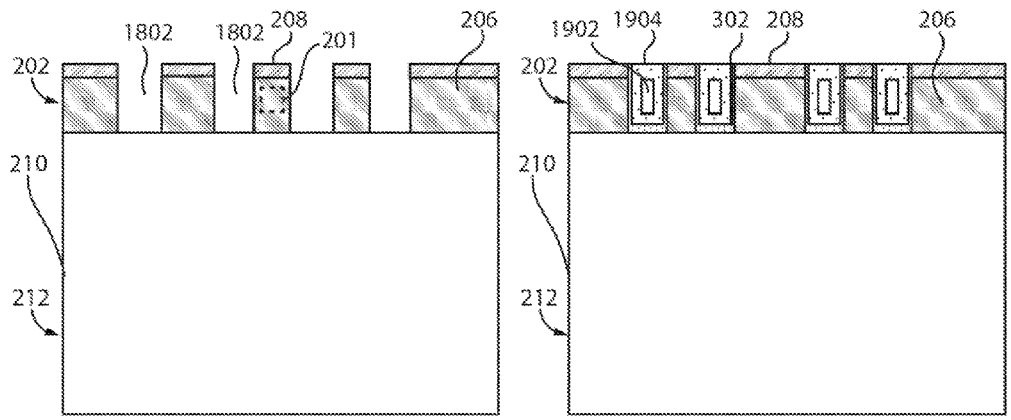
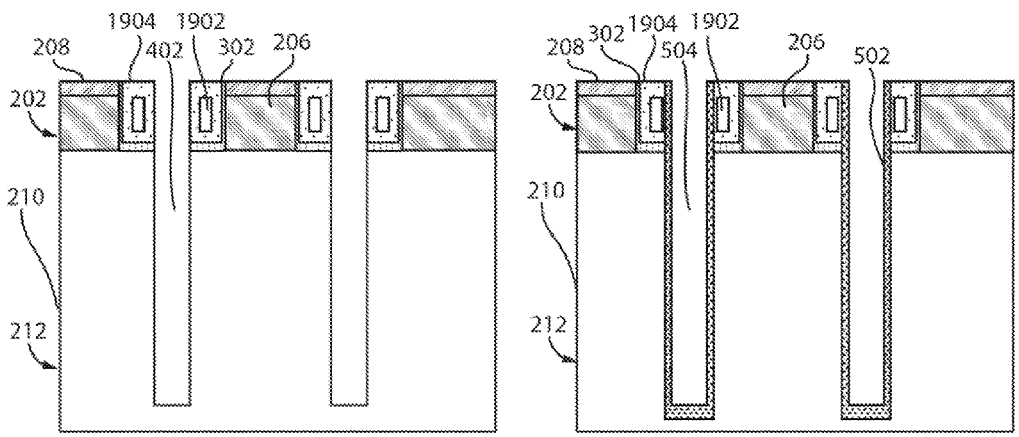
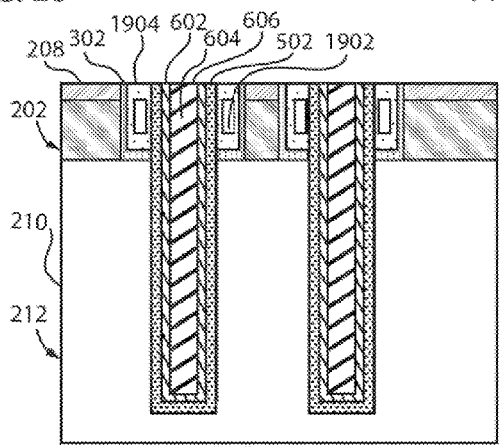

THROUGH-VIAS FOR WIRING LAYERS OF SEMICONDUTOR DEVICES

RELATED APPLICATION DATA

This application is a Continuation application of co-pending U.S. patent application Ser. No. 13/865,740 filed on Apr. 18, 2013, incorporated herein by reference in its entirety

BACKGROUND

1. Technical Field

The present invention relates to semiconductor devices, and, more particularly, to through-vias for semiconductor devices and methods of their fabrication.

2. Description of the Related Art

Certain wiring techniques in semiconductor devices, especially back-end of line (BEOL) wiring techniques, fabricate wiring layers by depositing a soft, low-k dielectric material on a semiconductor substrate, patterning channels or voids in the dielectric material and then depositing conductive material within the channels to form wires in the device. For convenience purposes, one common method forms through-vias in the device after some of the wiring has already been fabricated. For example, manufacturing setups and operations typically are configured to form finer structures near the bottom wiring layers and comparatively coarser structures near the top wiring layers. Thus, because through-vias are relatively coarse structures, manufacturing can be facilitated by forming the through-vias simultaneously with other coarse structures for the upper regions of the wiring layer.

SUMMARY

One embodiment of the present invention is directed to a method for forming a through-via in a semiconductor device. In accordance with the method, a first etch through at least a first dielectric material of a wiring layer of the semiconductor device is performed such that a first hole outlining a collar structure for the through-via is formed. In addition, a stress-abating dielectric material is deposited in the first hole such that the stress-abating dielectric material is disposed at least laterally from the first dielectric material. Further, a second etching through at least a semiconductor material of a semiconductor layer that is disposed below the wiring layer is performed, where the second etching forms a via hole in the semiconductor material. Additionally, at least a portion of the via hole is filled with conductive material to form the through-via such that the stress-abating dielectric material, at least in the wiring layer, provides a buffer between the conductive material and the first dielectric material.

Another embodiment is also directed to a method for forming a through-via in a semiconductor device. In accordance with the method, a first etching through a first dielectric material of a wiring layer of the semiconductor device and through a semiconductor material of a semiconductor layer that is disposed below the wiring layer is performed. Here, the first etching forms a via hole in the wiring layer and in the semiconductor material. In addition, a second etching in the first dielectric material of the wiring layer that widens the via hole in the wiring layer is performed. Further, a stress-abating dielectric material is deposited in the via hole in the wiring layer such that the stress-abating dielectric material is disposed at least laterally from the first dielectric material. Additionally, at least a portion of the via hole is filled with conductive material to form the through-via such that the stress-abating dielectric material, at least in the wiring layer, provides a buffer between the conductive material and the first dielectric material.

Another embodiment is directed to a through-via structure in a semiconductor device comprising a conductor structure, a dielectric via lining and a stress-abating dielectric material. The conductor structure is formed of conducting material extending through a wiring layer of the semiconductor device and through a semiconductor layer below the wiring layer. Here, the wiring layer of the semiconductor device includes a first dielectric material. The dielectric via lining extends along the conductor structure at least in the semiconductor layer. Further, the stress-abating dielectric material is disposed between the conductor structure and the first dielectric material in at least the wiring layer, where the stress-abating dielectric material is disposed over portions of the semiconductor layer that are outside outer boundaries of the via lining.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIGS. 7-11 provide cross-sectional views of various stages of fabrication of an alternative through-via structure including a stress-abating dielectric buffer that extends into a semiconductor layer in accordance with an exemplary embodiment;

FIGS. 18-22 provide cross-sectional views of various stages of fabrication of a through-via structure including a stress-abating dielectric buffer with pinch-off voids that improve flexibility in accordance with an exemplary embodiment;

DETAILED DESCRIPTION OF PREFERRED EMBODIMENTS

Figure 1:
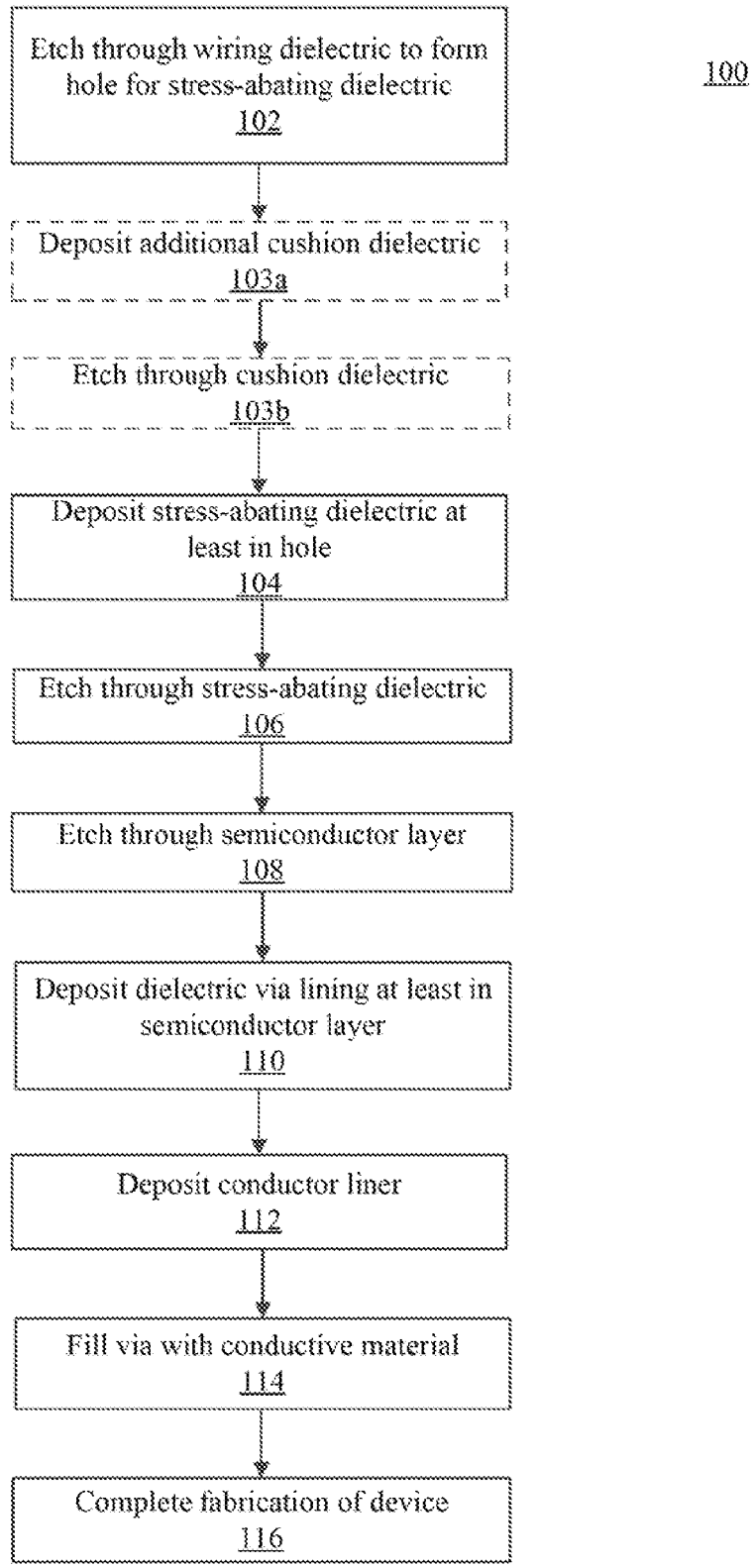
FIG. 1 is a flow diagram of a method for forming a through-via in a semiconductor device in accordance with an exemplary embodiment of the present invention.

One problem with forming a through-via through wiring layers of semiconductor devices is that some of these wiring layers employ relatively fragile dielectric material. Conductive fill materials for the via, especially copper fill material, impose significant stresses on the wiring layers as well as the via insulation due to thermal excursions that occur during further wafer processing. The thermal excursions and resulting stresses can lead to cracking of the fragile dielectrics of the wiring layer and of the through-via insulation. The methods and structures described herein provide a means for reinforcing and cushioning the immediate region around the through-via to prevent this type of damage. In addition, the structures can also improve wafer fracture strength and can reduce stresses on any semiconductor devices and/or semiconductor memory trenches near the through-via, thereby reducing the minimum exclusion zone that is typically defined around the through-via.

In accordance with exemplary aspects of the present invention, the through-via can be fabricated by forming a collar structure within the wiring layers through multiple etches and filling the collar structure with suitable dielectric material that is effective in absorbing stresses imposed by thermal expansion of the via fill material during thermal processing of the device. In addition to abating stresses in the immediate lateral region of the via, the collar structure also reduces the magnitude of vertical thermal expansion, also known as "copper pumping," as it provides a lateral outlet for expansion. Various embodiments of via structures that can achieve these beneficial effects are described herein below.

As will be appreciated by one skilled in the art, aspects of the present invention may be embodied as a system, method or a device. Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of systems, methods and devices according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture having a substrate or wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It should also be noted that when a first element is described herein as being "over" a second element, the first element is above the second element along a perpendicular line between the first and second element.

A design for an integrated circuit chip in accordance with the embodiments described herein may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys, game machines and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of" for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figures 2, 3:
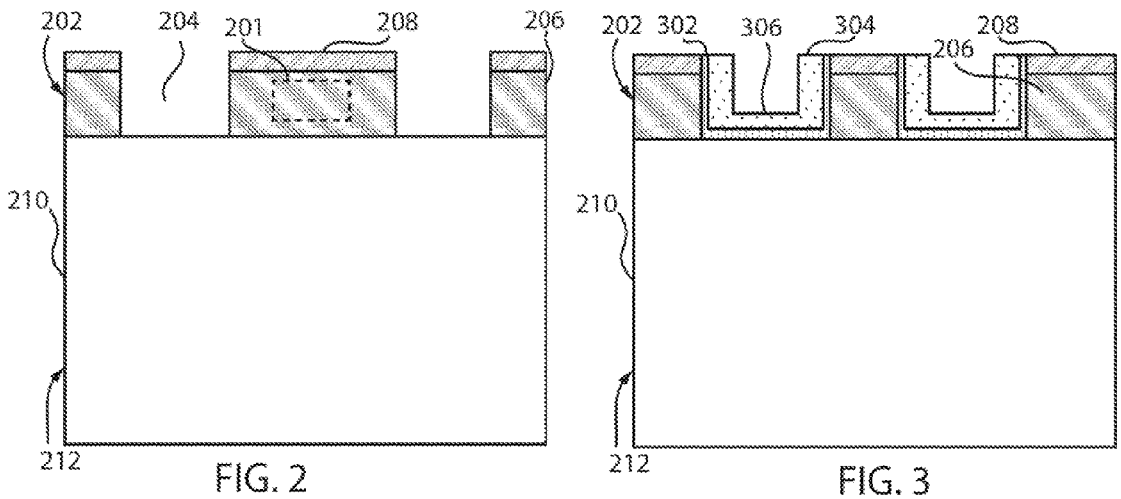
FIGS. 2-6 provide cross-sectional views of various stages of fabrication of a through-via structure including a stress-abating dielectric buffer in a wiring layer in accordance with an exemplary embodiment.

Referring now to the drawings in which like numerals represent the same or similar elements and initially to FIG. 1, a method 100 for forming a through-via structure in accordance with various exemplary embodiments of the present invention. FIGS. 2-6 depict stages of the fabrication of through-vias in accordance with one particular embodiment and reference is made to these figures here for illustrative purposes. The method 100 can begin at step 102, at which, as illustrated in FIG. 2, a wiring layer 202 is etched to form a hole 204 outlining a collar structure for a through-via in which a stress-abating dielectric material can be deposited. Here, at least some fine wiring 201 has been formed within the layer 202. The etching of step 102 can be implemented with a reactive ion etch (RIB) process. The layer 202 includes a soft, low-k dielectric material 206 and a hard, high-k dielectric material 208, both of which can be oxides and can be etched through to form the collar structure, as illustrated in FIG. 2. For example, the hard, high-k dielectric material 208 can be forms of $SiO_2$, such as, for example, Tetraethyl orthosilicate (TEOS), fluorine-doped TEOS (FTEOS) and Silane Oxide. In addition, materials of intermediate hardness can be employed as dielectric material 208. For example, the dielectric material 208 can be soft or hard Octamethylcyclotetrasiloxane (OMCTS) materials or a possibly semi-compliant material of a silicon oxide variant. Further, the soft dielectric material 206 can be composed of SiCOH materials, hydrogen silsesquioxane (HSQ) or methylsilsesquioxane (MSQ).

At step 104, a stress-abating dielectric material can be deposited at least in the hole formed at step 102. For example, preliminarily, in this embodiment, as illustrated in FIG. 3, a U-shaped silicon-nitride based liner 302, such as carbon doped silicon nitride, SiON, SiN, $SiC_xN_yH_z$ (where x,y,z vary), is deposited in the hole. Thereafter, a stress-abating dielectric material 304, which is preferably an oxide, is deposited over the liner 302 to form a U-shaped structure of the stress-abating dielectric material 304. The stress-abating dielectric material 304 can be one or more forms of $SiO_2$ such as, for example, OMCTS. As shown in FIG. 3, the stress-abating dielectric material is disposed at least laterally, along the horizontal plane of the illustration provided in FIG. 3, from the dielectric material 206 of the wiring layer 202. The U-shape of the stress-abating dielectric material 304 renders the structure to be self-aligned in that a separate mask need not be employed to form a through-via in subsequent etching steps.

Figures 4, 5:
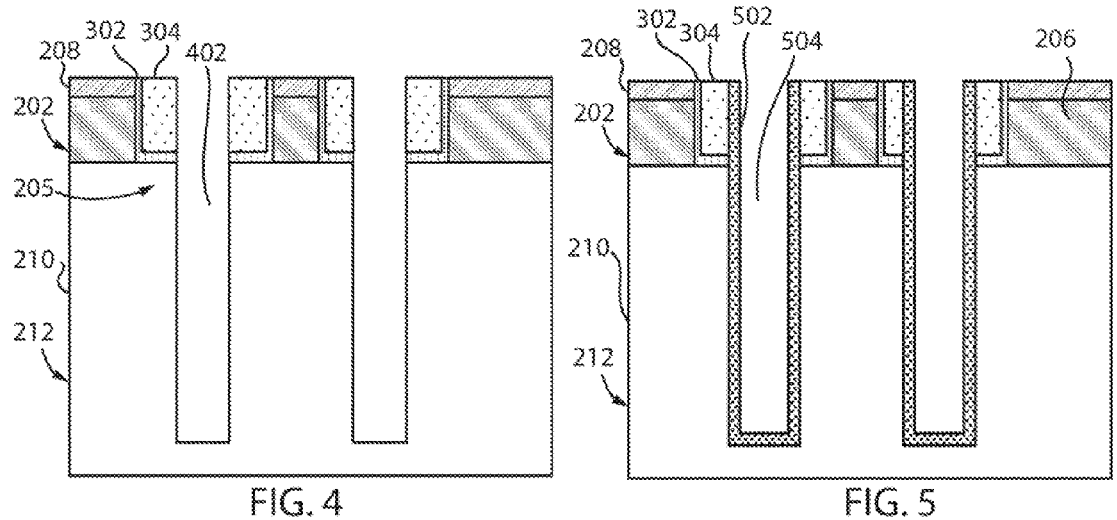

At step 106, dielectric material can be etched to expose the underlying semiconductor material 210. For example, as illustrated in FIGS. 3-4, the bottom portion 306 of the U-shaped stress abating dielectric 304 is etched through using an RIE process. The semiconducting material can be for example, silicon, SiGe, or other semiconducting materials.

At step 108, the semiconductor layer 212 beneath the opening in the stress-abating dielectric material formed at step 106 can be etched through to form a via hole. For example, as illustrated in FIG. 4, the via hole 402 can be formed in the semiconductor material 210 by employing a deep reactive ion etch (DRIE) method. In alternative implementations of the embodiments described herein, the etching can be performed with a RIE method as opposed to a DRIE method. Implementing RIE as opposed to DRIE can avoid any scalloping that can occur with DRIE, resulting in a smoother wall of the via hole, thereby increasing its fracture strength. In the embodiment illustrated in FIGS. 2-6, the etching process is simplified, as the stress-abating dielectric material 304 acts as a mask for the DRIE/RIE of step 108. The semiconducting material 210 can be a silicon substrate, a SiGe substrate, or other suitable semiconductor material. Further, the diameter of the via hole 402 is smaller than the diameter of the hole 204 formed at step 102 to form the collar structure. Thus, the stress-abating dielectric material 304 is disposed over portions of the semiconductor layer and semiconductor material that are outside of the boundaries of the via hole.

At step 110, a dielectric via lining can be deposited at least in the via hole bordering the semiconductor material 210 of the semiconductor layer 212. For example, as illustrated in FIG. 5, the dielectric via lining 502 can be deposited along the entire via hole 402. In a preferred embodiment, the dielectric via lining is an oxide, most preferably a high-aspect-ratio process (HARP) oxide.

At step 112, a conductor liner can be deposited within the via hole. For example, a dual layer 602 of Ti/TiN or Ta/TaN can be deposited in the via hole 504, as illustrated in FIG. 6.

At step 114, the via hole can be filled with a conductive material. For example, a conductive material 604, such as copper, for example, can be deposited in the via hole to complete the fabrication of the via 606. It should be noted that other suitable materials for the conductive material 604 may be employed.

At step 116, the fabrication of the semiconductor device can be completed. For example, the via 606 can be capped, additional wiring can be formed in the wiring layer 202, etc.

Figure 6:
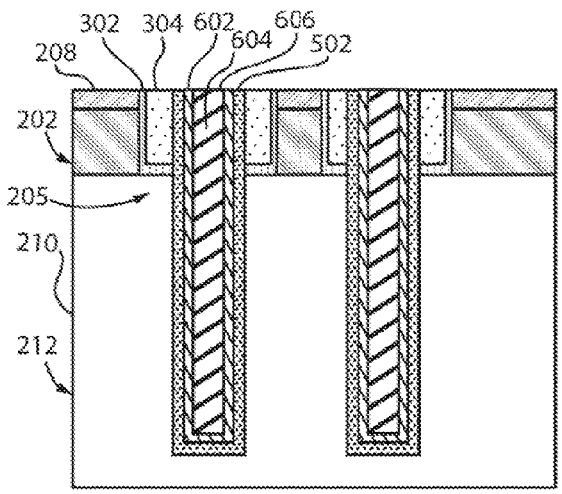
Figure 12:
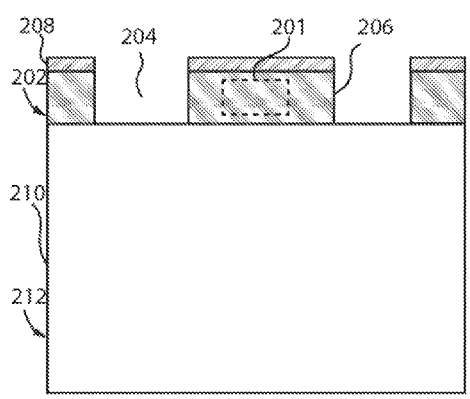
FIGS. 12-17 provide cross-sectional views of various stages of fabrication of a through-via structure in accordance with an alternative exemplary embodiment.

As illustrated in FIG. 6, the conductor structure 604 formed of the conductive material extends through the wiring layer 202 of the semiconductor device and through a semiconductor layer 212 below the wiring layer 202. Further, the dielectric via lining 502 extends along the semiconductor structure at least in the semiconductor layer, and as illustrated in FIG. 6, and can extend into the wiring layer 202 such that the lining 502 is disposed between the stress abating dielectric material 304 and the conductor structure 604. In addition, to form the collar structure of the via, the stress-abating dielectric material 304 is disposed over portions 205 of the semiconductor layer 212 that are outside of the outer boundaries of the via lining 502 in the semiconductor layer 212. As noted above, thermal processes that are conducted to complete the fabrication of the device can cause the conductive material 604 of the via to expand and impose potentially damaging stresses on relatively fragile dielectric material 206 of the wire layer 202. The collar structure of the stress-abating dielectric material 304 acts as a cushion to absorb the stresses and protect the adjacent wiring dielectric material 206 from fracturing. In particular, the stress-abating dielectric material 304 provides a buffer between the conductive material 604/dielectric via lining 502 of the via 606 and the relatively soft dielectric material 206 of the wiring layer 202. The stress-abating dielectric material of other exemplary embodiments described herein similarly provide a buffer between the conductive material/dielectric via lining of the via and the soft dielectric 206 of the wiring layer 202.

FIGS. 7-11 illustrate an alternative embodiment of a through-via structure that can be formed in accordance with the method 100. Here, the method 100 is essentially performed as discussed above with respect to the embodiment of FIGS. 2-6, except that the etching performed at step 102 etches through a portion of the semiconductor material 210 and forms a deeper hole 706 that outlines the collar structure, as illustrated in FIG. 7. Thus, here, a deeper U-shaped SiN-based liner 702 and a deeper U-shaped stress-abating material 704 can be formed as discussed above with respect to step 104 and FIG. 3 using the same materials, as illustrated in FIG. 8. As such, in this embodiment, the stress-abating dielectric material 704 extends into the semiconductor layer 212 and borders and protects both the wiring dielectric 206 as well as a portion of the semiconductor material 210 of the semiconductor layer 212. Thereafter, as illustrated in FIG. 9, to form the via hole 902, the stress-abating dielectric material 704 can be etched as discussed above with respect to step 106 and FIG. 4 and the semiconductor material 210 can be etched as discussed above with respect to step 108 and FIG. 4. Further, as illustrated in FIG. 10, the dielectric via lining 502 can be formed as discussed above with respect to step 110 and FIG. 5 using the same material. In addition, as illustrated in FIG. 11, the conductor liner 602 and the via fill material 604 can be deposited as discussed above with respect to steps 112 and 114 and FIG. 6. The deeper stress-abating structure 704 provides increased strength and also ensures that more uniform stresses, due to thermal expansion of the via material 604, are applied on any trenches formed in the semiconductor material 210. The use of a deeper etch at step 102 and the formation of deeper stress-abating dielectric structures at steps 104 and 106 can be applied to any embodiment described herein.

Figure 13:
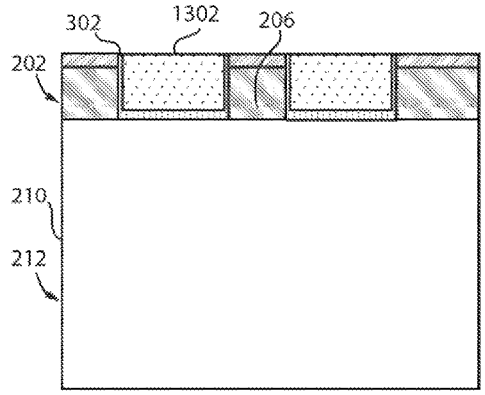
Figure 14:
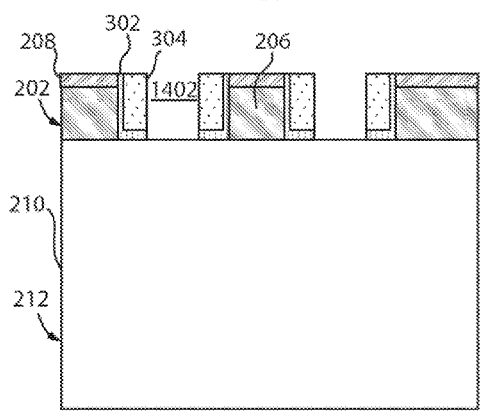
Figure 15:
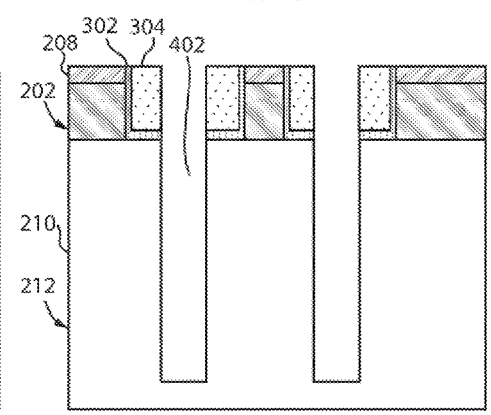
Figure 16:
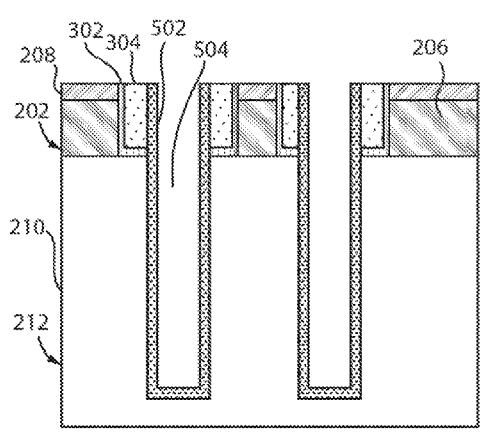
Figure 17:
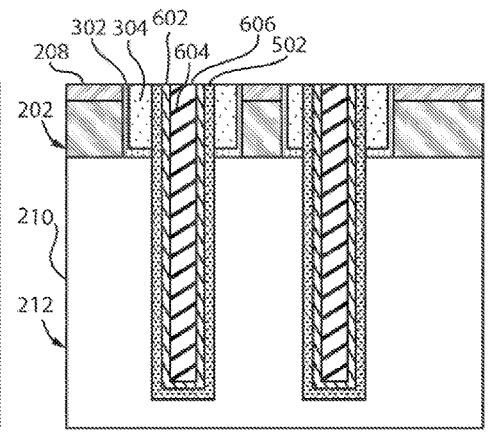
Figure 23:
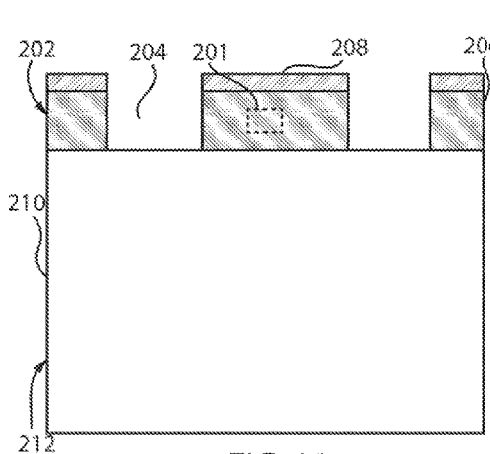
FIGS. 23-27 provide cross-sectional views of various stages of fabrication of a through-via structure including a stress-abating buffer composed of a soft dielectric material in a wiring layer in accordance with an exemplary embodiment.

With reference now to FIGS. 12-17, fabrication stages of an alternative embodiment of the method 100 is illustratively depicted. Here, the method 100 is essentially performed as discussed above with respect to the embodiment of FIGS. 2-6, except that the deposition step 104 for the stress-abating dielectric material 1302 fills the entirety of the remaining hole over the SiN-based material 302, as illustrated in FIG. 13, and except that the etching of step 106 etches through more of the stress-abating dielectric material to form the hole 1402, as illustrated in FIG. 14. Steps 104 and 106 are otherwise performed as discussed above with regard to steps 104-106 and FIGS. 3-4, using the same materials. In addition, the remaining steps are performed as discussed above with respect to steps 108-116 and FIGS. 4-6, which are essentially identical to FIGS. 15-17, respectively, in this embodiment. The filling of stress-abating dielectric material 1302 may offer convenience under certain circumstances, where the dielectric material 1302 is used to insulate other features formed in the wiring layer 202.

Referring to FIGS. 18-22, with continuing reference to FIG. 1, an alternative embodiment for forming a through-via is illustratively depicted. In accordance with this embodiment, the etching step 102 can be implemented as discussed above with respect to step 102 and FIG. 2 except that the hole is formed in the shape of an annulus and is situated and sized to outline the final shape of the collar structure of the stress-abating dielectric material. The method 100 proceeds to step 104 and is performed by depositing a silicon nitride based liner 302, as discussed above with respect to FIG. 3, and by subsequently implementing a plasma-enhanced chemical vapor deposition (PECVD) of an oxide to form stress-abating dielectric material 1904 comprising one or more pinch-off holes or voids 1902. For example, the stress-abating dielectric material 1904 can be PECVD $SiO_2$. Thereafter, at step 106, a portion of the hard dielectric 208 and a portion of the soft dielectric material 206 of the wiring layer between the stress-abating dielectric material 1904 can be etched using a RIE process. In this example, the portion of the hard dielectric 208 and the portion of the soft dielectric material 206 of the wiring layer within the annulus formed at step 102 can be etched using a RIE process, as illustrated in FIG. 20. Further, at step 108, as illustrated in FIG. 20, the semiconductor material 210 can be etched as described above with respect to FIG. 4 to form the via hole 402. Similar to the stress-abating dielectric material 304, the stress abating dielectric material 1904 can act as an etch mask to simplify fabrication of the hole 402. Thereafter, as illustrated in FIGS. 21-22, the dielectric via lining 502, the conductor liner 602 and the conductive material 604 can be deposited as discussed above with regard to steps 110-114 and FIGS. 5-6. The use of the pinch-off holes or voids 1902 provides an added benefit of increased flexibility in the collar structure formed by the stress-abating dielectric material as compared to the other embodiments discussed above, which in turn provides a more effective reduction of stresses imposed on the wiring dielectric material 206, and also the semiconductor material 210 if the dielectric collar structure 1904 were to extend into the semiconductor material 210.

Figure 24:
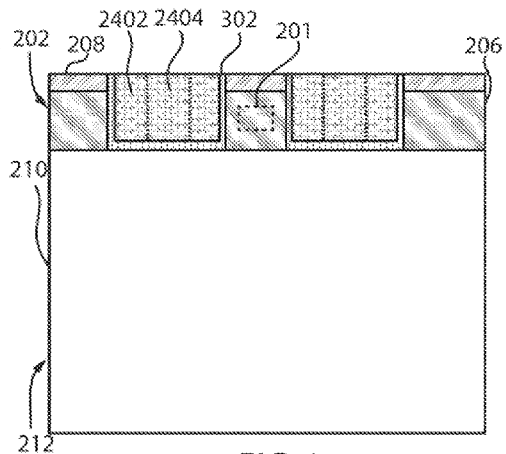
Figure 25:
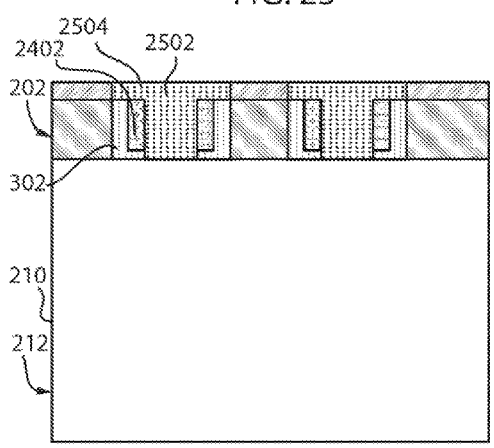
Figure 26:
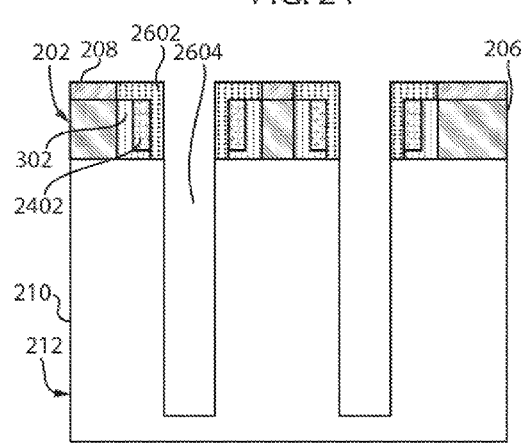
Figure 27:
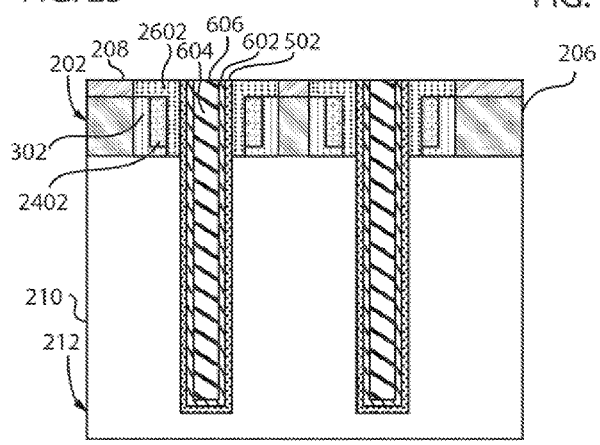

With reference to FIGS. 23-27, with continuing reference to FIG. 1, an alternative embodiment for forming a through-via is illustratively depicted. In accordance with this embodiment, a soft or low-k dielectric material can be employed as an added cushion in lieu of or in addition to the silicon-nitride based material. For example, the etching step 102 can be performed as described above with respect to FIG. 2 to obtain the structure illustrated in FIG. 23. The method then may proceed to optional step 103a in which a soft or low-k dielectric material 2402 is deposited along the outer boundaries of the hole 204 formed at step 102, as illustrated in FIG. 24. In this particular embodiment, the dielectric material 2402 is employed to provide added flexibility and stress abatement and thereby protect the fragile dielectric material 206 of the wiring layer 202. Further, the silicon-nitride based liner 302 may also be deposited, as discussed above with respect to step 104 and FIG. 3, prior to deposition of material 2402 to line the material 2402. Here, the dielectric material 2402 is more flexible than dielectric material 2502 that is subsequently deposited. Similar to the soft dielectric material 206, the dielectric material 2402 can be composed of SiCOH materials, HSQ or methylsilsesquioxane. As illustrated in FIG. 25, the method may proceed to optional step 103b, at which the soft or low-k dielectric material 2402 is etched to outline the region 2404 in which the stress-abating material is deposited at step 104 and to remove an upper region of the dielectric material for purposes of forming a cap. Step 104 may be performed as discussed above to form the stress-abating dielectric structure with respect to FIG. 3 using the same material for the stress-abating dielectric structure 2502; however, here, the stress-abating dielectric material 2502 also forms a cap 2504 above the soft or low-k dielectric structure 2402, as illustrated in FIG. 25. In addition, the deposition of the silicon-nitride based material is not performed, as it was performed previously to line the material 2402. Further, the dielectric material 2502 is deposited in a region 2404 of the hole formed at step 102 that is disposed between the dielectric material 2402. Thereafter, step 106 can be performed as discussed above with respect to FIGS. 13-14 to etch through the dielectric material 2502 to form the stress-abating dielectric structure 2602. In addition, step 108 can be performed as discussed above with respect to FIGS. 14-15 to form a via hole 2604. Further, as illustrated in FIG. 27, the dielectric via lining 502, the conductor liner 602 and the conductive material 604 can be deposited as discussed above with regard to steps 110-114 and FIGS. 5-6.

Figure 28:
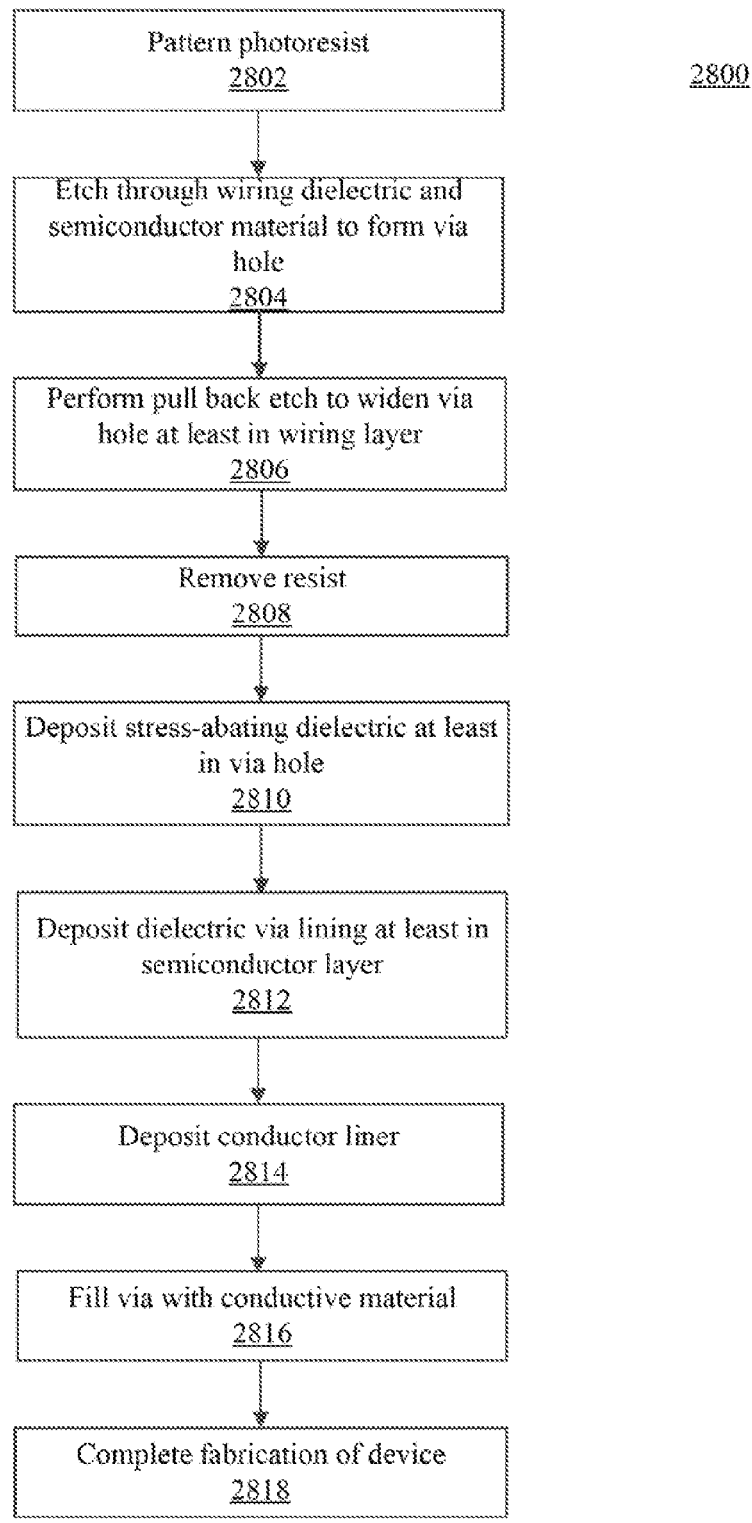
FIG. 28 is a flow diagram of a method for forming a through-via in a semiconductor device using a pull-back etch in accordance with an exemplary embodiment of the present invention.

Referring now to FIG. 28, an alternative method 2800 for forming a through-via structure in accordance with exemplary embodiments is depicted. Reference is also made to FIGS. 29-32 to demonstrate various stages of the fabrication process. The method 2800 can begin at step 2802, at which a photoresist 2902 is patterned in accordance with standard lithography methods.

Figures 29, 30:
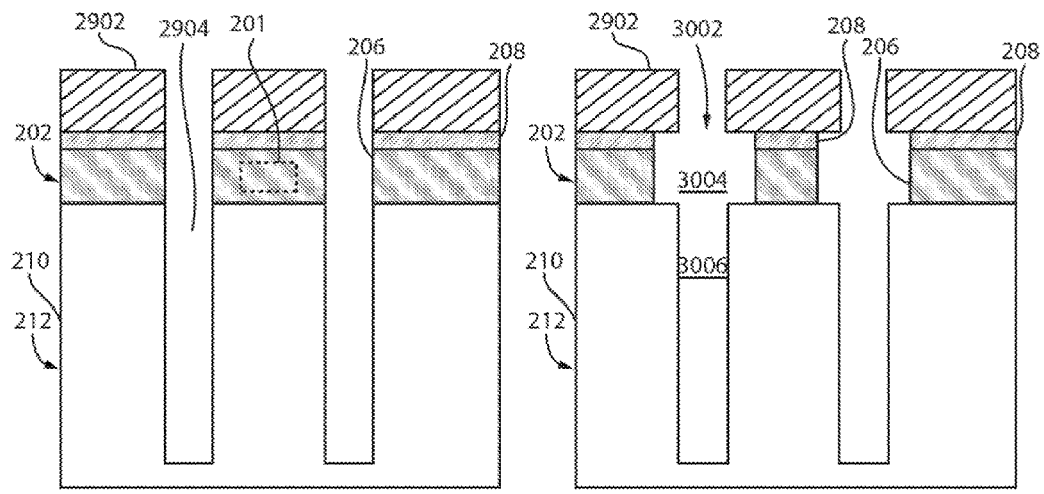
FIGS. 29-32 provide cross-sectional views of various stages of fabrication of a through-via structure using the method illustrated in FIG. 28 in accordance with an exemplary embodiment.

At step 2804, as illustrated in FIG. 29, an etch can be performed through the wiring dielectric 206 of the wiring layer 202 and through the semiconductor material 210 of the semiconductor layer 212 that is disposed below the wiring layer 202 to form a via hole 2904 in the wiring layer 202 and the semiconductor layer 212. Here, the etch can be implemented using a DRIE process through the wiring dielectric 206 and the semiconductor material 210.

At step 2806, a pull back etch can be performed to widen the via hole at least in the wiring layer. For example, as illustrated in FIG. 30, the via hole 2904 can be widened to form a via hole 3002 that includes a wider portion 3004 in the wiring layer 202 than the remaining portion 3006 of the via hole 3002 in the semiconductor layer 212. In other embodiments, the wider portion 3004 can extend into the semiconducting material of the semiconductor layer 212. Here, a wet or dry isotropic pull back etch can be performed to widen the via hole 2904 at selected portions.

Figures 31, 32:
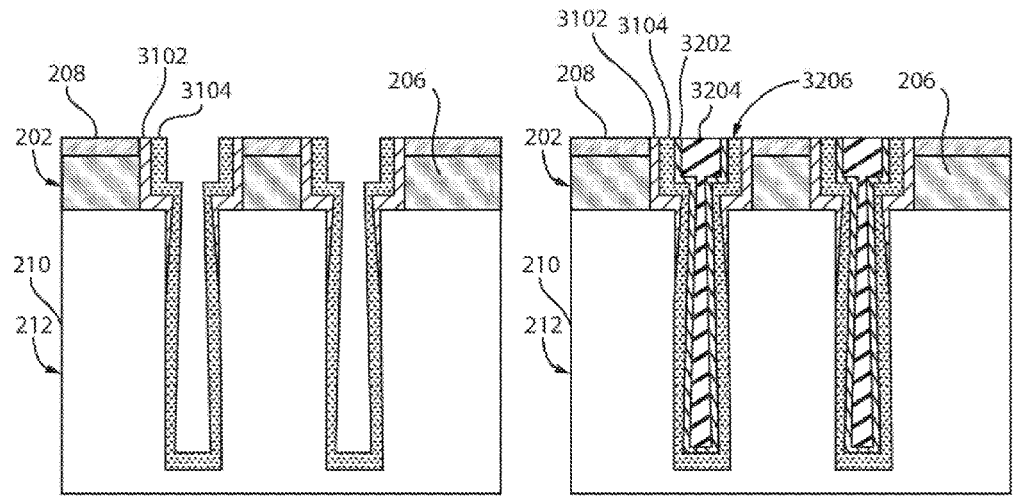

At step 2808, the photoresist 2902 can be removed, as illustrated in FIG. 31.

At step 2810, a stress-abating dielectric material 3102 can be deposited in the via hole 3002. For example, the stress-abating dielectric material 3102 can be a silane oxide to ensure that most of the material remains within the wiring layer 202. However, some of the material 3102 can be deposited within the portion 3006 of the via hole in the semiconductor layer 212. Alternatively, the stress abating semiconductor material 3102 can be composed of the same materials discussed above with respect to step 104 of the method 100. In addition, optionally, a silicon-nitride based material can be deposited in at least the portion 3004 of the via hole 3002 in the wiring layer 202 before the stress-abating dielectric material is deposited, as discussed above with respect to step 104 using the same or similar materials. As illustrated in FIG. 31, the stress-abating dielectric material 3102 is disposed at least laterally from the dielectric material 206 of the wiring layer along a horizontal axis in the illustration provided in FIG. 31. Further, in this embodiment, the dielectric material 3102 can extend into the semiconductor layer 212, as shown in FIG. 31.

At step 2812, a dielectric via lining can be deposited at least in the semiconductor layer 212. For example, as illustrated in FIG. 31, a dielectric via lining 3104 can be deposited in both portions 3004 and 3006 of the via hole 3002 as discussed above with respect to step 110 and can be formed of the same dielectric materials describe above with respect to step 110.

At step 2814, a conductor liner 3202 can be deposited at least in the semiconductor layer 212. For example, as illustrated in FIG. 32, a conductive liner 3202 can be deposited in both portions 3004 and 3006 of the via hole 3002 as discussed above with respect to step 112 and can be formed of the same materials discussed above with respect to step 112.

At step 2816, a conductive material 3204 can be deposited at least in the semiconductor layer 212 to form the through-via 3206. For example, as illustrated in FIG. 32, a conductive material 3204 can be deposited in both portions 3004 and 3006 of the via hole 3002 as discussed above with respect to step 114 and can be formed of the same materials discussed above with respect to step 114.

A step 2818, fabrication of the device can be completed, as discussed above with respect to step 116. As shown in FIG. 32, the final structure of the via 3206 is configured such that the stress-abating material 3102, at least in the wiring layer 202, provides a buffer between the conductive material 3204 of the via 3206 and the soft dielectric material 206. Here, the stress-abating material 3102 mitigates any stresses imposed by the conductive material 3204 on the soft dielectric 206 of the wiring layer due to any thermal expansion of the conductive material 3204 during thermal processing employed to fabricate the device.

Figure 33:
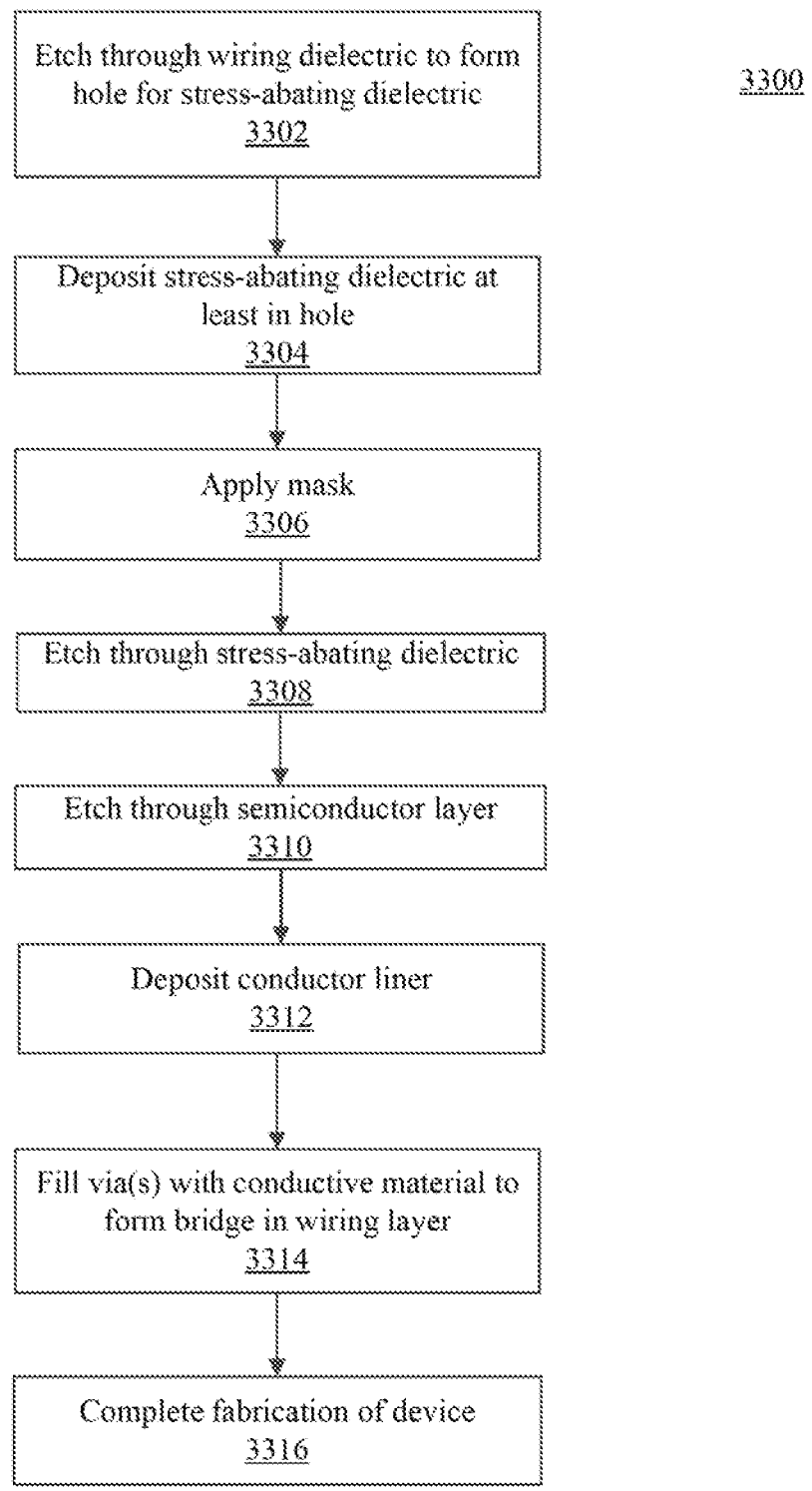
FIG. 33 is a flow diagram of a method for forming a through-via including a stress-abating buffer material in a wiring layer and including a bridge in the conductor structure of the via in accordance with an exemplary embodiment of the present invention.
Figure 34:
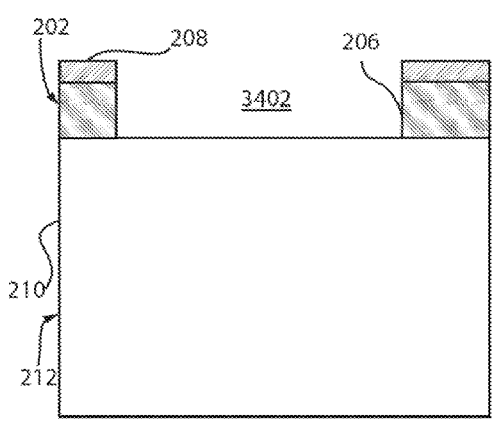
FIGS. 34-38 provide cross-sectional views of various stages of fabrication of a through-via structure using the method illustrated in FIG. 33 in accordance with an exemplary embodiment.

Referring now to FIG. 33, an alternative method 3300 for forming a through-via structure in accordance with exemplary embodiments is depicted. Reference is also made to FIGS. 34-38 to demonstrate various stages of the fabrication process. The method 3300 can begin at step 3302, at which a wiring dielectric material is etched to form a hole outlining a collar structure for a through-via in which a stress-abating dielectric material can be deposited. For example, as illustrated in FIG. 34, the hard dielectric material 208 and the soft dielectric material 206 of the wiring layer 202 can be etched to form hole 3402. The etching can be performed in accordance with an RIE process.

Figure 35:
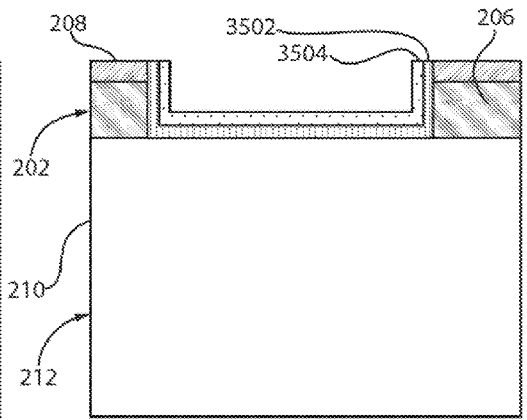

At step 3304, the stress-abating dielectric material can be deposited in the hole 3402 formed at step 3302. For example, as illustrated in FIG. 35, a silicon-nitride based layer 3502, such as a layer of carbon doped silicon nitride material or other silicon-nitride based materials described above, can be deposited. In addition, the stress-abating dielectric material 3504 can be deposited thereafter to form a U-shaped layer, similar to the embodiment illustrated in FIG. 3. Here, the dielectric material 3504 may be a HARP oxide. Alternatively, the stress-abating dielectric material 3504 can be any of the materials described above with respect to step 104 and FIG. 3.

At step 3306, a mask can be formed using standard photolithography techniques. For example, a metal mask with a thin photoresist can be employed, possibly with a hard mask. Here, the mask creates an annulus shape for purposes of etching the through-via hole. However, the mask can form other shapes in other various embodiments.

At step 3308, the stress-abating dielectric material deposited at step 3304 can be etched and the mask can be removed. In this example, an annulus shaped hole is formed in the wiring layer.

Figure 36:
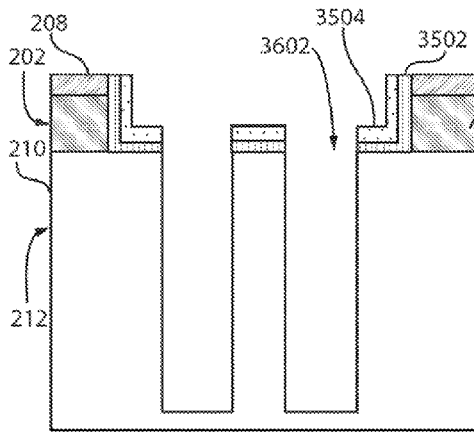

At step 3310, an etching through the semiconductor layer 212 can be performed. For example, as illustrated in FIG. 36, the remaining portions of the stress-abating dielectric 3504 can act as a mask for etching through the semiconductor material 210 of the semiconductor layer 212 and an annulus shaped via hole 3602 is formed in the semiconductor material 210.

Figure 37:
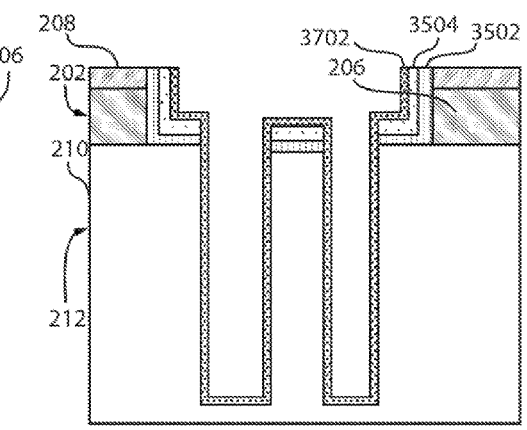

At step 3312, a conductor liner can be deposited within the via hole. For example, a dual layer 3702 of Ti/TiN or Ta/TaN can be deposited in the via hole 3602, as illustrated in FIG. 37.

At step 3314, the via hole can be filled with a conductive material. For example, a conductive material 3802, such as copper or any other suitable conductive material, can be deposited in the via hole to complete the fabrication of the via 3804.

At step 3316, the fabrication of the semiconductor device can be completed. For example, the via 3804 can be capped, additional wiring can be formed in the wiring layer 202, etc.

Figure 38:
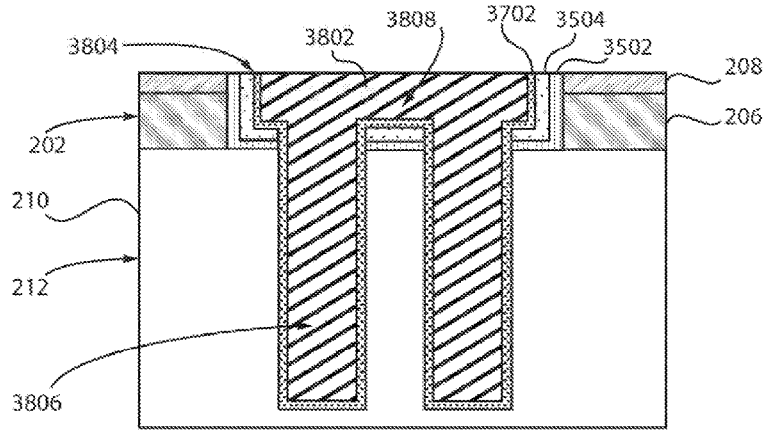

As illustrated in FIG. 38, the conductor structure 3802 formed of the conductive material includes one or more extensions 3806 that extends into the semiconductor layer 212. The extensions can be an annulus, as shown in FIG. 38, or can be a plurality of pillars. In either case, the conductor structure includes a bridge 3808 formed of the conductive material that bridges top portions of the extension(s) in the wiring layer 202. The bridge configuration illustrated here provides advantages in that copper pumping (if copper is used as the conductive material), which can occur during subsequent thermal processing, along the vertical direction is mitigated.

It should be noted that the two via structures illustrated in the cross-sectional diagrams of the figures can be separate vias or can be a single annular via. Further, the methods can be performed such that only a single via structure is formed.

It should also be noted that in the embodiment described with respect to FIGS. 33-38, the dielectric via lining was omitted for purposes of grounding the through-via through the semiconducting material 210. However, in other exemplary embodiments, a dielectric via lining can be formed as discussed above with respect to step 110 to insulate the through-via in implementation described above with respect to FIGS. 33-38. In addition, it should also be noted that, in accordance with other exemplary implementations of the present invention, the dielectric via lining can optionally be omitted in all of the embodiments described herein for purposes of grounding the via through the semiconductor material 210.

Having described preferred embodiments of through-vias for wiring layers of semiconductor devices and methods of their fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A through-via structure in a semiconductor device comprising:
   - a conductor structure formed of conducting material extending through a wiring layer of said semiconductor device and through a semiconductor layer below said wiring layer, said wiring layer of said semiconductor device including a first dielectric material;
   - a dielectric via lining that extends along the conductor structure at least in the semiconductor layer; and
   - a porous stress-abating dielectric material formed in a collar structure disposed between said conductor structure and said first dielectric material in at least said wiring layer, wherein the stress-abating dielectric material extends between the semiconductor layer to a top surface of the wiring layer.

2. The through-via structure of claim 1, wherein the dielectric via lining further extends into the wiring layer such that the dielectric via lining is disposed between the stress-abating dielectric material and said conductor structure.

3. The through-via structure of claim 1, wherein the stress-abating dielectric material extends into the semiconductor layer.

4. The through-via structure of claim 1, wherein the stress-abating dielectric material includes at least one void that increases flexibility of a collar structure formed by the stress-abating semiconductor material.

5. The through-via structure of claim 1, further comprising a third dielectric material disposed between said first dielectric material and said stress-abating dielectric material in said wiring layer, wherein said third dielectric material is more flexible than said stress-abating dielectric material.

6. The through-via structure of claim 5, wherein the stress-abating dielectric material caps said third dielectric material.

7. The method of claim 1, wherein the porous stress-abating dielectric material is deposited by a high-aspect ratio process (HARP).

* * * * *